US008159006B2

(12) United States Patent
Maeda et al.

(10) Patent No.: US 8,159,006 B2
(45) Date of Patent: Apr. 17, 2012

(54) SEMICONDUCTOR DEVICE HAVING A TRIPLE GATE TRANSISTOR AND METHOD FOR MANUFACTURING THE SAME

(75) Inventors: Shigenobu Maeda, Seongnam-Si (KR); Jeong-Hwan Yang, Suwon-Si (KR); Junga Choi, Youngin-Si (KR)

(73) Assignee: Samsung Electronics Co., Ltd. (KR)

( * ) Notice: Subject to any disclaimer, the term of this patent is extended or adjusted under 35 U.S.C. 154(b) by 1105 days.

(21) Appl. No.: 12/008,232

(22) Filed: Jan. 9, 2008

(65) Prior Publication Data
US 2008/0211022 A1    Sep. 4, 2008

Related U.S. Application Data

(62) Division of application No. 11/024,616, filed on Dec. 29, 2004, now Pat. No. 7,339,213.

(30) Foreign Application Priority Data

Feb. 20, 2004  (KR) .................................... 04-11328

(51) Int. Cl.
H01L 29/06   (2006.01)
(52) U.S. Cl. ................. 257/255; 257/627; 257/E29.004
(58) Field of Classification Search .................. 257/255, 257/521, 627, 628, E29.003, E29.004
See application file for complete search history.

(56) References Cited

U.S. PATENT DOCUMENTS
6,642,090 B1   11/2003   Fried et al.
(Continued)

FOREIGN PATENT DOCUMENTS
JP     1990-130852    5/1990
(Continued)

OTHER PUBLICATIONS

Lee, Jong-Ho. "Simulation Study of a New Body-Tied FinFETs (Omega MOSFETs) Using Bulk Si Wafers," Semiconductor and Material Devices Lab Annual Report 2003, School of Electrical Engineering, Seoul National University, URL: <http://smdl.snu.ac.kr/Research/annual/annual2003/index.html>.

(Continued)

Primary Examiner — Colleen Matthews
(74) Attorney, Agent, or Firm — Onello & Mello, LLP (57) ABSTRACT

In a semiconductor capable of reducing NBTI and a method for manufacturing the same, a multi-gate transistor includes an active region, gate dielectric, channels in the active region, and gate electrodes, and is formed on a semiconductor wafer. The active region has a top and side surfaces, and is oriented in a first direction. The gate dielectric is formed on the top and side surfaces of the active region. The channels are formed in the top and side surfaces of the active region. The gate electrodes are formed on the gate dielectric corresponding to the channels and aligned perpendicular to the active region such that current flows in the first direction. In one aspect of the invention, an SOI layer having a second orientation indicator in a second direction is formed on a supporting substrate having a first orientation indicator in a first direction. A multi-gate transistor is formed on the SOI layer. The first direction and the second direction are the same, or the first direction is at 45 degrees with respect to the second direction. In another aspect of the invention, the intersection of the top and side surfaces of the active region are curved, further reducing NBTI. In another aspect of the invention, a multi-gate transistor is formed on a shallow trench isolation region of a bulk wafer.

7 Claims, 12 Drawing Sheets

U.S. PATENT DOCUMENTS

| | | | |
|---|---|---|---|
| 6,867,433 | B2 | 3/2005 | Yeo et al. |
| 7,042,009 | B2 | 5/2006 | Shaheen et al. |
| 7,230,287 | B2 | 6/2007 | Anderson et al. |
| 2002/0011612 | A1 | 1/2002 | Hieda |
| 2003/0042531 | A1 | 3/2003 | Lee et al. |
| 2003/0102497 | A1 | 6/2003 | Fried et al. |
| 2003/0102518 | A1 | 6/2003 | Fried et al. |
| 2003/0227036 | A1 | 12/2003 | Sugiyama et al. |
| 2004/0150029 | A1 | 8/2004 | Lee |
| 2004/0217420 | A1* | 11/2004 | Yeo et al. ............... 257/347 |
| 2005/0280121 | A1 | 12/2005 | Doris et al. |
| 2007/0063306 | A1 | 3/2007 | Doyle et al. |

FOREIGN PATENT DOCUMENTS

| | | | |
|---|---|---|---|
| JP | 2002-118255 | | 4/2002 |
| JP | 2003-298051 | | 10/2003 |
| WO | 2003/003442 | A1 | 1/2003 |
| WO | 2004/061972 | A1 | 7/2004 |

OTHER PUBLICATIONS

Schroder, Dieter K. and Babcock, Jeff A. "Negative bias temperature instability: Road to cross in deep submicron silicon semiconductor manufacturing," Journal of Applied Physics, vol. 94, No. 1, Jul. 1, 2003, p. 1-18.

Peters, Laura. "NBTI: A Growing Threat to Device Reliability," Semiconductor International, URL: <http://www.reed-electronics.com/semiconductor/article/CA386329>, Mar. 1, 2004.

Maeda, Shigenobu, et al. "Negative Bias Temperature Instability in Triple Gate Transistors," IEEE 42nd Annual International Reliability Physics Symposium, Phoenix, 2004, p. 8-12.

Lemme, M., et al. "Subthreshold Characteristics of p-type Triple-Gate MOSFETs," ESSDERC 2003. Proceedings of the 33rd European Solid-State Device Research, IEEE Catalog No. 03EX704, Sep. 16-18, 2003, p. 123-126.

"Crystal Planes in Semiconductors," Department of Electrical & Computer Engineering at Brigham Young University, URL: <http://www.ee.byu.edu/cleanroom/EW_orientation.phtml>.

Office Action issued in related Japanese Application JP2005042948 on Oct. 11, 2011.

Office Action issued on Dec. 12, 2011 by European Patent Office in corresponding European Patent Application No. 05250932.0-1528.

Office Action issued on Jan. 17, 2012 by Japanese Patent Office in corresponding Japanese Patent Application No. JP2005042948.

* cited by examiner

SEMICONDUCTOR DEVICE HAVING A TRIPLE GATE TRANSISTOR AND METHOD FOR MANUFACTURING THE SAME

This application is a divisional of U.S. application Ser. No. 11/024,616, field Dec. 29, 2004, which relies for priority upon Korean Patent Application No. P2004-0011328, filed on Feb. 20, 2004, the contents of which are herein incorporated by reference in their entirety.

BACKGROUND OF THE INVENTION

1. Field of the Invention

The present invention relates to a semiconductor device having a multi-gate transistor and a method for manufacturing the same, and more specifically, to a semiconductor device and a method for manufacturing the device in which the degradation due to negative bias temperature instability (NBTI) in triple gate transistors is reduced.

2. Description of Related Art

Multi-gate transistors, including triple gate and FinFET transistors, are one of the most promising candidates for 10 nm-level gate length MOSFETs. These transistors are based on fully-depleted silicon-on-insulator (SOI) MOSFETs that improve short channel characteristics and improve subthreshold behavior by offering an ideal subthreshold swing, which guarantees the scaling merits of speed enhancement and power reduction.

One reliability issue regarding scaled MOSFETs is negative bias temperature instability (NBTI). NBTI occurs in MOSFETs under constant voltage, where bias temperature stress under the constant voltage causes the generation of interface traps $N_{IT}$ between the gate oxide and silicon substrate, resulting in a threshold voltage $V_T$ shift and a loss of drive current $I_{ON}$ as a function of time.

It is generally understood that NBTI degradation is due to hydrogenated silicon dangling bonds at the $Si/SiO_2$ interface. NBTI-stress-induced interface trap generation has been identified as being due to breaking of Si—H bonds induced by inversion layer holes and subsequent diffusion of broken hydrogen in the form of $H_2$ species.

Multi-gate transistors have different trap state densities at the interface for each channel due to different crystal orientations. This may also be due to the channels in the multi-gate transistors having oxides of different qualities. Therefore, an increase in trap states on the side channel surface of the multi-gate transistor may occur. In addition, the surrounding gate structure of a triple gate transistor locally enhances the electric field, which may also cause NBTI degradation. The NBTI effect is found to be more severe for PMOS FETs than NMOS FETs due to the presence of holes in the PMOS inversion layer that are known to interact with the oxide states. NBTI in p-MOSFETs, involving interface and bulk trap generation and causing device parameter degradation, is a serious reliability concern for both analog and digital CMOS circuits. NBTI is most problematic for high-performance or high-reliability devices, and analog/mixed-signal devices are more susceptible than digital devices.

Figure 1A:
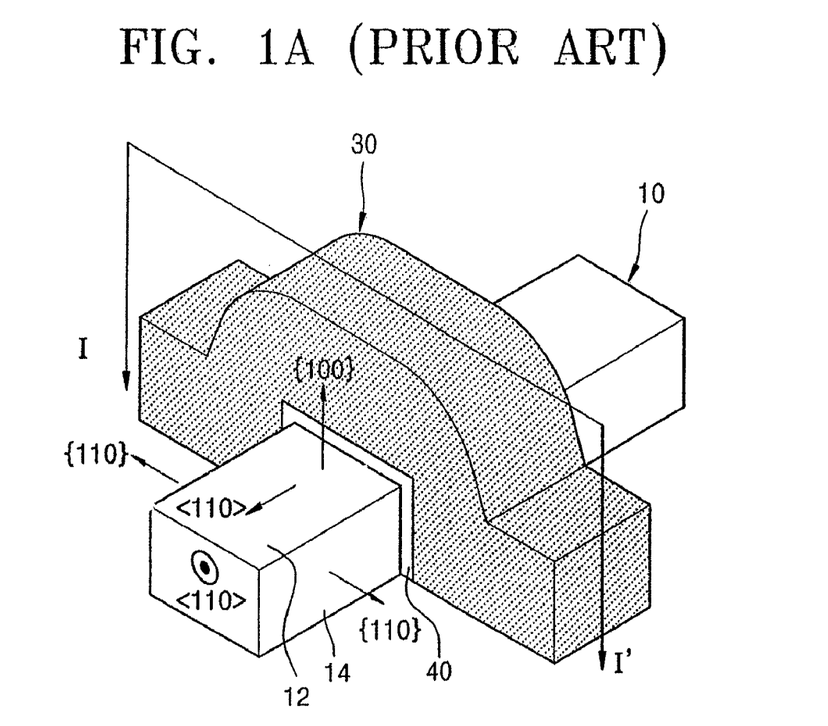
FIG. 1A contains a schematic oblique view of the structure of a conventional triple gate transistor.
Figure 1B:
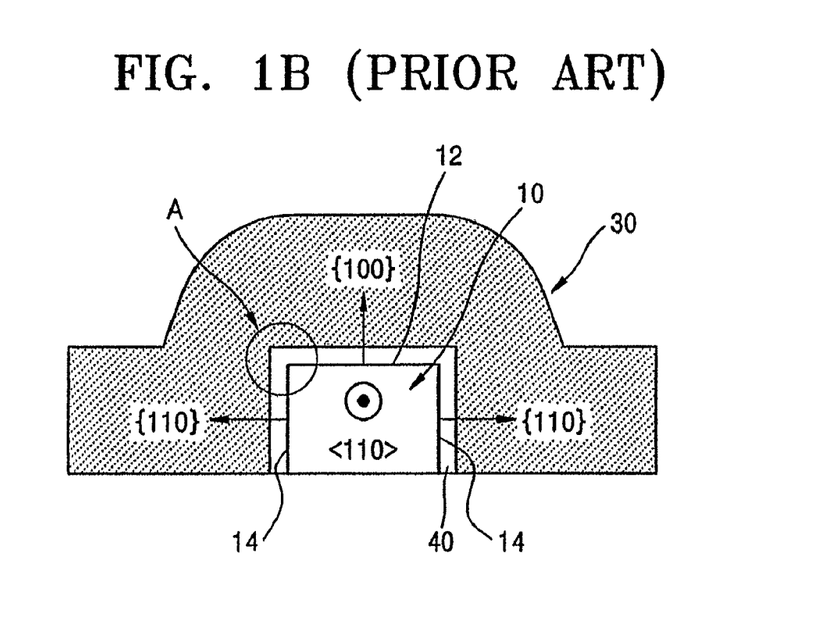
FIG. 1B contains a schematic cross-sectional view of the conventional triple gate transistor of FIG. 1A, taken along line I-I' of FIG. 1A.

FIG. 1A contains a schematic oblique view illustrating the structure of a conventional triple gate transistor. FIG. 1B contains a schematic cross-sectional view of the conventional triple gate transistor of FIG. 1A, taken along line I-I' of FIG. 1A. The triple gate transistor of FIGS. 1A and 1B comprises an active region 10, a gate electrode 30, and a gate dielectric 40. The active region 10 has a top surface 12 and side surfaces 14. The top surface 12 of the active region has a crystal plane in a {100} orientation and the side surfaces 14 of the active region have crystal planes in a {100} orientation. It is generally understood that the crystal orientations {100} and {110} follow the Miller Indices convention, identifying a family of equivalent planes in a silicon diamond cubic lattice structure. In this configuration, NBTI occurs because there are a larger number of trap states in the {110} surfaces. The NBTI results in large threshold voltage shifts in the side channel transistors.

In addition, the interface traps can occur in the corners of the active region where the electric field in the gate oxide is stronger than the other flat gate oxide regions, and which can be another cause of NBTI in triple gate transistors.

SUMMARY OF THE INVENTION

To address the above limitations, a first feature of the present invention is to provide a semiconductor device having a triple gate transistor that is capable of minimizing NBTI.

A second feature of the present invention is to provide a method for forming a semiconductor device having a triple gate transistor that is capable of minimizing NBTI.

In accordance with a first aspect of the invention, there is provided a semiconductor device comprising a semiconductor wafer and a multi-gate transistor formed on the semiconductor wafer. The multi-gate transistor comprises an active region, a gate dielectric, channels in the active region, and gate electrodes. The active region of the multi-gate transistor has top and side surfaces. The top and side surfaces are formed in crystal planes of a first orientation. The active region is oriented in a first direction. The gate dielectric is formed on the top and side surfaces of the active region. Channels are formed in the top and side surfaces of the active region. Gate electrodes are formed on the gate dielectric corresponding to the channels and are aligned such that the gate electrodes are perpendicular to the active region. Since the gate electrodes are perpendicular to the active region, current flows in the first direction.

The crystal planes of the first orientation can be {100} crystal planes. The first direction can be a <100> crystal direction.

The semiconductor wafer can comprise an orientation indicator that indicates a <110> crystal direction, wherein the active region of the multi-gate transistor is aligned at 45 degrees with respect to the orientation indicator.

According to another aspect of the present invention, there is provided an SOI device including a supporting substrate, a SOI layer, and a multi-gate transistor. The supporting substrate has a first orientation indicator in a first direction. The SOI layer is formed over the supporting substrate, and has a second orientation indicator in a second direction. The multi-gate transistor is formed on the SOI layer, and comprises an active region in the multi-gate transistor, channels formed in the active region, and gate electrodes corresponding to the channels. The active region in the multi-gate transistor has a top and side surfaces and is aligned at 45 degrees with respect to the second direction. The channels are formed in the top and side surfaces of the active region. The gate electrodes corresponding to the channels are aligned perpendicular to the active region.

In one embodiment, the first direction and the second direction are the same, or the first direction can be 45 degrees with respect to the second direction. The second direction can be the <110> crystal direction, and the active region can be aligned in the <100> crystal direction.

In another embodiment, the active region has the top and side surfaces in {100} crystal planes.

In accordance with certain embodiments, the semiconductor device and the SOI device may further include an intersection of the top and side surfaces of the active region that is curved. A radius of curvature of the curve at the intersection of the top and side surfaces may be at least 4.5 times the thickness of the gate dielectric.

According to another aspect of the present invention, there is provided a semiconductor device comprising a semiconductor wafer, a shallow trench isolation region, and a multi-gate transistor. The shallow trench isolation region is on the semiconductor wafer. The multi-gate transistor is on the semiconductor wafer in proximity to the shallow trench isolation region. The multi-gate transistor comprises an active region, a gate dielectric, and gate electrodes. The active region has a top and side surfaces formed in crystal planes of a first orientation, wherein the active region has a first direction. The gate dielectric is formed on the top and side surfaces of the active region. The gate electrodes are formed on the gate dielectric and aligned perpendicular to the active region such that current flows in the first direction.

The crystal planes of the first orientation can be {100} crystal planes. The first direction can be a <100> crystal direction.

The semiconductor wafer can include an orientation indicator that can indicate a <110> crystal direction. The active region can be aligned 45 degrees with respect to the orientation indicator.

The top and side surfaces of the active region can be curved. A radius of curvature at the intersection of the top and side surfaces can be formed to be at least 4.5 times the thickness of the gate dielectric.

A lower portion of the shallow trench isolation region can contain a dielectric material.

In accordance with another aspect of the invention, there is provided a method for forming a semiconductor device. In the method, a semiconductor wafer is provided, and a multi-gate transistor is formed on the semiconductor wafer. Forming the multi-gate transistor comprises forming an active region having a top and side surfaces in crystal planes of a first orientation and orienting the active region in a first direction. A gate dielectric is formed on the top and side surfaces of the active region. Channels are formed in the top and side surfaces of the active region. Gate electrodes are formed on the gate dielectric corresponding to the channels and are aligned perpendicular to the active region.

The active region can be formed having the top and side surfaces in {100} crystal planes. The active region can be oriented in a <100> crystal direction.

The semiconductor wafer can have an orientation indicator which indicates a <110> crystal direction, and the active region can be aligned 45 degrees with respect to the orientation indicator.

An intersection of the top and side surfaces of the active region can be curved. A radius of curvature at the intersection of the top and side surfaces can be formed to be at least 4.5 times the thickness of the gate dielectric.

In accordance with another aspect of the present invention, there is provided a method for forming a SOI device. In this method, a supporting substrate is formed having a first orientation indicator in a first direction. An SOI layer is formed over the supporting substrate and has a second orientation indicator in a second direction. A multi-gate transistor is formed on the SOI layer. Forming the multi-gate transistor comprises forming an active region having a top and side surfaces, wherein the active region is aligned at 45 degrees with respect to the second direction. Channels are formed in the top and side surfaces of the active region. Gate electrodes corresponding to the channels are formed and are aligned perpendicular to the active region.

In one embodiment, the first direction and the second direction can be the same or the first direction can be at 45 degrees with respect to the second direction.

The method of forming the SOI layer can comprise forming a buried oxide layer, then forming a Si surface layer on the buried oxide layer. The Si surface layer can define the second direction. The first direction and the second direction can be the same, or the first direction can be 45 degrees with respect to the second direction.

The active region can be formed having a top and side surfaces in {100} crystal planes. The second direction can be the <110> crystal direction, wherein the active region is oriented in a <100> crystal direction.

An intersection of the top and side surfaces of the active region can be curved. A radius of curvature at the intersection of the top and side surfaces can be formed to be at least 4.5 times the thickness of the gate dielectric.

In forming the active region with the curved intersection of the top and side surfaces, a buffer oxide layer is formed on the SOI layer. A silicon nitride layer is formed on the buffer oxide layer. The silicon nitride layer and the buffer oxide layer are etched to form a mask. An active region is defined using the mask. The SOI layer is oxidized to form an oxidized SOI layer. The oxidized layer and the Si surface layer are etched using the mask. The silicon nitride layer and the oxidized layer are removed, exposing the active region. The step of oxidizing the SOI layer can create a "bird's beak" shape in the oxidized layer to create the curved intersection of the top and side surfaces of the active region. The step of forming the active region can further comprise aligning a lithography mask having an active pattern 45 degrees with respect to the second direction of the SOI layer, or aligning a lithography mask having a <110> oriented active pattern at 45 degrees with respect to the second direction of the SOI layer. The step of forming the gate electrodes can comprise oxidizing the exposed active region.

In accordance with another aspect of the present invention, there is provided another method of forming a semiconductor device. In this method, a semiconductor wafer is formed. A shallow trench isolation region is formed on the semiconductor wafer. A multi-gate transistor is formed on the semiconductor wafer in proximity to the shallow trench isolation region. With regard to the formation of the multi-gate transistor, an active region is formed having a top and side surfaces in crystal planes of a first orientation. A gate dielectric is formed on the top and side surfaces of the active region. Gate electrodes are formed on the gate dielectric and are aligned perpendicular to the active region.

The crystal planes of the first orientation can be formed as {100} crystal planes. The first direction can be in the <100> crystal direction.

The active region can be formed with a curved intersection of the top and side surfaces. A radius of curvature at the intersection of the top and side surfaces can be formed to be at least 4.5 times the thickness of the gate dielectric.

An orientation indicator on the semiconductor wafer can indicate a <110> crystal direction. The active region can be formed by aligning a lithography mask at 45 degrees with respect to the orientation indicator. The active region can also be formed by aligning a lithography mask with the orientation indicator, the mask having a <110> oriented pattern at 45 degrees with respect to the orientation indicator.

The gate dielectric and the gate electrode can be formed sequentially. The shallow trench isolation region can be formed by filling a lower portion of the shallow trench isolation region with dielectric materials.

According to the present invention, an active region of a triple gate transistor having a top surface on a {100} crystal plane and side surfaces on a {100} crystal plane is formed by orienting the channel to have a <100> direction, and allowing current to flow substantially along the <100> direction. This approach can reduce the degradation of NBTI in triple gate transistors, as distinguished from transistors formed in {110} crystal planes, in which no channels exist on the side surfaces of the {110} crystal planes. Further, NBTI can be mitigated by an active region having a rounded corner between the channel regions in the top and side surfaces of the active region for preventing the electric field from concentrating to the gate dielectric in the corner. For these reasons, a significant reduction in NBTI can be achieved.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thicknesses of layers are exaggerated for clarity.

DETAILED DESCRIPTION OF PREFERRED EMBODIMENTS

In the following detailed description, whenever a layer or structure is referred to as "on" another layer or structure, the first layer or structure may be directly on the second layer or structure, or other intervening layers or structures may be present.

Figure 2A:
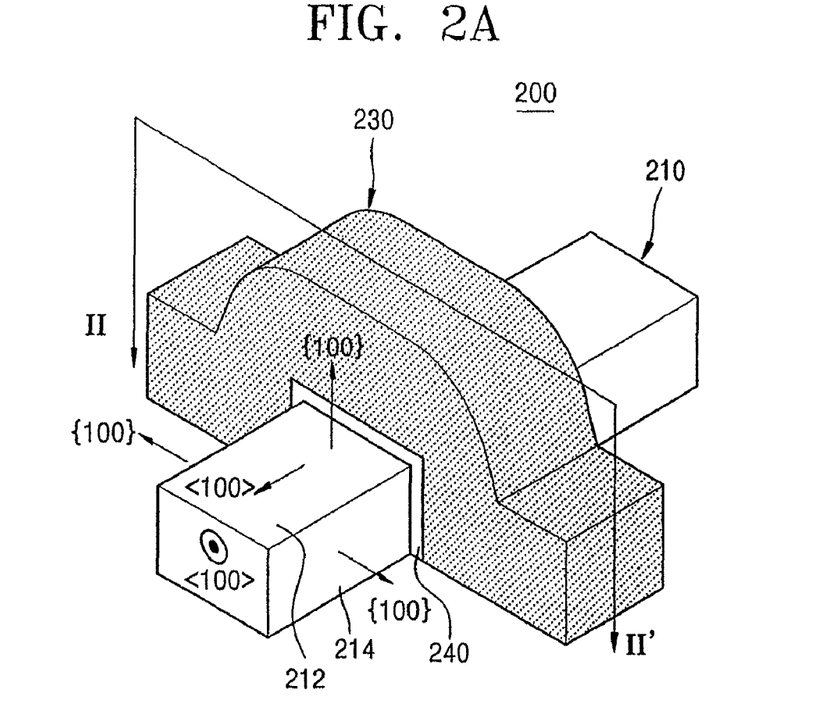
FIG. 2A contains a schematic oblique view of a triple gate transistor according to an embodiment of the present invention.

FIG. 2A contains a schematic oblique view of a triple gate transistor according to an embodiment of the present invention. The transistor 200 includes an active region 210, a gate dielectric 240, and a gate electrode 230. The triple gate transistor 200 is formed on a semiconductor wafer (not shown). In one embodiment, the triple gate transistor is a p-type MOSFET. The active region 210 can be formed as a mesa-type pattern by mesa etching the semiconductor wafer. The active region has a top surface 212 and side surfaces 214. Each of the top and side surfaces is formed on a crystal plane, which describe the orientation of the plane of silicon atoms relative to the principle crystalline axes.

Figure 2B:
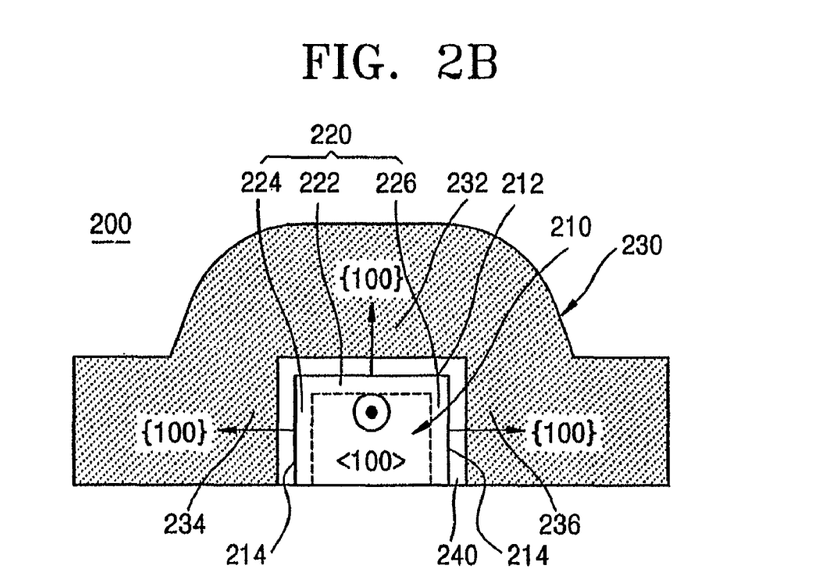
FIG. 2B contains a schematic cross-sectional view of the triple gate transistor of FIG. 2A, taken along line II-II' of FIG. 2A.

FIG. 2B contains a schematic cross-sectional view of the triple gate transistor of FIG. 2A, taken along line II-II' of FIG. 2A. Referring to FIG. 2B, the triple gate transistor 200 is further described. Since the active region is a mesa type pattern, the active region contains channels in its top and side surfaces. Channel 220 includes a first channel region 222, a second channel region 224, and a third channel region 226 formed in the active region 210. The first channel region 222 is formed in the top surface of the active region. The second and third channel regions 224, 226 are formed in the side surfaces of the active region 210.

The gate electrode 230 comprises a first gate electrode 232 corresponding to the first channel region 222, and second and third gate electrodes 234, 236 corresponding to the second and third channel regions 224, 226, respectively.

In accordance with the invention, in the device 200 of FIGS. 2A and 2B, the top surface 212 of the active region is on a {100} crystal plane, and the side surfaces 214 of the active region are on {100} crystal planes, by orienting the channel 220 in a <100> channel direction, wherein current flows substantially along the <100> channel direction. In this manner, the top and side surfaces formed on a {100} crystal plane can reduce degradation of NBTI, as distinguished from side surfaces formed on {110} crystal planes, because the side channels of triple gate transistors on a {100} surface have lower surface trap density than a {110} surface.

Figure 3:
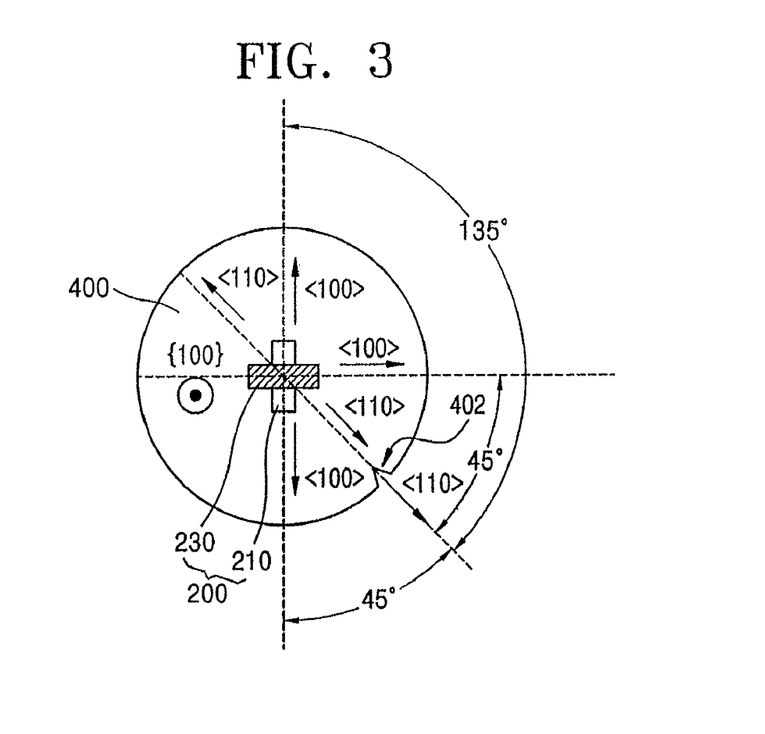
FIG. 3 contains a schematic top view of a semiconductor wafer on which is formed the triple gate transistor of FIGS. 2A and 2B.

FIG. 3 contains a schematic top view of a semiconductor wafer on which is formed the triple gate transistor of FIGS. 2A and 2B. Referring to FIG. 3, the triple gate transistor 200 is formed on a {100} crystal plane of the semiconductor wafer 400. The semiconductor wafer 400 has an orientation notch 402 that serves as a mark to indicate a <110> crystal direction.

As is well known, the orientation notch 402 can also be a flat formed at the edge of the wafer 400. When the active region 210 is a mesa type pattern having channel regions in its top and side surfaces, the channel regions automatically have {100} crystal planes since the crystal direction of the active region 210 of the triple gate transistor is the <110> crystal direction. The active region 210 can be rotated 45 degrees with respect to the orientation notch 402, as shown in FIG. 3, such that the active region 210 is oriented along the <100> crystal direction. The gate electrode remains aligned perpendicular to the active region such that current can flow between the source and drain of the triple gate transistor (not shown) substantially along the <100> crystal direction.

A relative relationship exists between the active region 210 and the orientation notch 402 by rotating the active region 45 degrees relative to the orientation notch 402. This can be achieved by forming a mask (not shown) having an active region pattern that is rotated 45 degrees with respect to the orientation notch 402 of the semiconductor wafer 400 and conventionally aligning the mask and the wafer during lithography to form the active region. Alternatively, a conventional mask having a <110> oriented active region pattern can be aligned to be rotated 45 degrees with respect to the orientation notch on the wafer to establish a 45 degree rotated relationship between the conventional mask and the semiconductor wafer during the lithography process. In either case, a 45 degree rotated relationship between the resulting active region and the semiconductor wafer is established.

Figure 4:
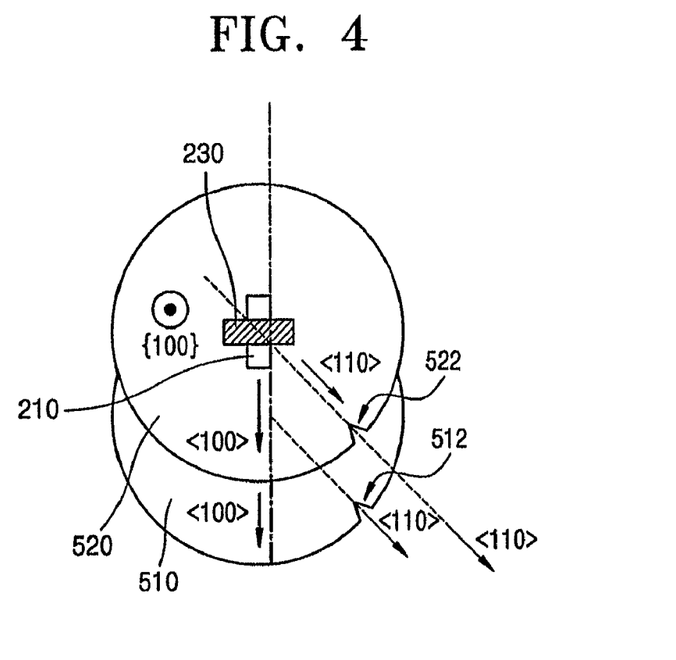
FIG. 4 contains a schematic top view of an SOI device comprising a triple gate transistor according to another embodiment of the present invention.

FIG. 4 contains a schematic top view of an SOI device comprising a triple-gate transistor according to another embodiment of the present invention. In FIG. 4, a first wafer, such as a silicon (Si) supporting substrate 510, is formed having an orientation notch 512 in a <110> direction. A second wafer such as SOI layer 520 is then formed having an orientation notch 522 aligned in the same <110> direction as the orientation notch 512 of the Si supporting substrate 510. The Si supporting substrate 510 and the SOI layer 520 can be bonded to each other. An active region 210 and a gate electrode 230 are formed on the SOI layer 520. When the <110> orientation notch 522 of the SOI layer 520 is aligned in the same direction as the <110> orientation notch 512 of the Si supporting substrate 510, the active region 210 can be rotated 45 degrees with respect to the <110> orientation notch such that current flows in the <100> direction, as shown in FIG. 4. This can be achieved by making a mask, for example a lithography mask (not shown), having an active region pattern rotated at 45 degrees with respect to the orientation notch 522 of the SOI layer 520. Alternatively, this can be achieved by aligning a conventional mask (not shown), having a <110> oriented active layer pattern, to the SOI layer 520 rotated at 45 degrees from the <110> orientation notch 522 during the lithography process used to form the active region 520. In either case, the resulting active region 210 would be fabricated rotated 45 degrees with respect to the <110> orientation notch 512 of the Si supporting substrate 510.

Figure 5:
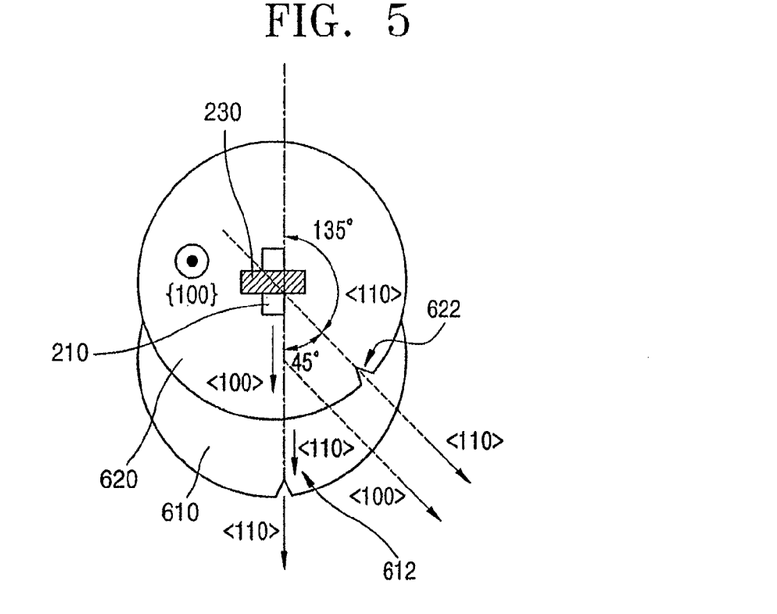
FIG. 5 contains a schematic top view of an SOI device comprising a triple gate transistor according to another embodiment of the present invention.

FIG. 5 contains a schematic top view of an SOI device comprising a triple gate transistor according to another embodiment of the present invention. In this embodiment, a Si supporting substrate 610 has an orientation notch 612 in the <110> direction, and an SOI layer 620 is formed having an orientation notch 622 in the <110> direction of the SOI layer. The SOI layer 620 is bonded to the Si supporting substrate 610 such that the notches 612 and 622 have 45 degree rotated directions with respect to each other. The triple gate transistor comprising an active region 210 and gate electrode 230 is formed in the <100> direction of the SOI layer 620 such that the triple gate transistor is aligned along the same <110> direction of the Si supporting substrate 620.

This configuration is used because of the cleavage characteristics of a wafer, which normally cleaves along the <110> direction. Therefore, when triple gate transistors are formed in the <100> direction, it becomes difficult to cleave the transistor along the channel direction. This makes cleaving analysis to check the cross-section of the SOI device very difficult, which is important in the development and manufacturing of a semiconductor device. Since the Si supporting substrate is significantly thicker than the SOI layer, the wafer can be cleaved along the <110> direction of the Si supporting substrate and the <100> direction of the SOI layer, such that the transistor, which is formed along the <100> direction of the SOI layer 620, can be analyzed in cross-section.

Figure 6A:
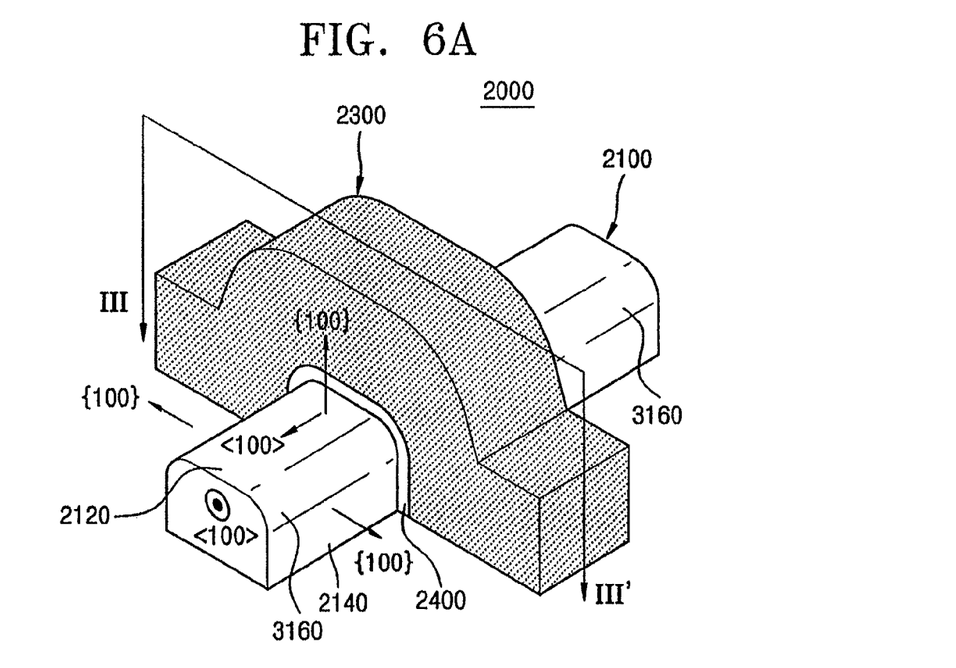
FIG. 6A contains a schematic oblique view of a triple gate transistor according to another embodiment of the present invention.
Figure 6B:
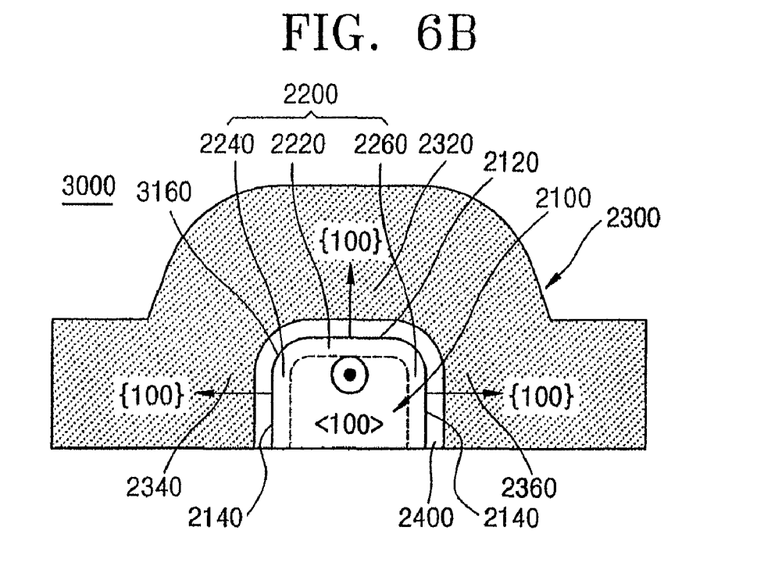
FIG. 6B contains a schematic cross-sectional view of the triple gate transistor of FIG. 6A, taken along line III-III' of FIG. 6A.

FIGS. 6A and 6B illustrate another embodiment of a semiconductor device comprising a triple gate transistor, in accordance with the invention. FIG. 6A contains a schematic oblique view of the triple gate transistor, and FIG. 6B contains a schematic cross-sectional view of the triple gate transistor of FIG. 6A, taken along lines III-III' of FIG. 6A. FIGS. 6A and 6B are analogous to FIGS. 2A and 2B described above. Referring to FIG. 6A, the transistor 2000 includes an active region 2100, a gate dielectric 2400, and a gate electrode 2300. The triple gate transistor 2000 is formed on a semiconductor wafer (not shown). In one embodiment, the triple gate transistor is a p-type MOSFET. The active region 2100 can be formed as a mesa-type pattern by mesa etching the semiconductor wafer. The active region has a top surface 2120 and side surfaces 2140. Each of the top and side surfaces is formed on a crystal plane, which describe the orientation of the plane of silicon atoms relative to the principle crystalline axes. Referring to FIG. 6B, the triple gate transistor 2000 is further described. Since the active region is a mesa type pattern, the active region contains channels in its top and side surfaces. Channel 2200 includes a first channel region 2220, a second channel region 2240, and a third channel region 2260 formed in the active region 2100. The first channel region 2220 is formed in the top surface of the active region. The second and third channel regions 2240, 2260 are formed in the side surfaces of the active region 2100.

The gate electrode 2300 comprises a first gate electrode 2320 corresponding to the first channel region 2220, and second and third gate electrodes 2340, 2360 corresponding to the second and third channel regions 2240, 2260, respectively.

In accordance with the invention, in the transistor of FIGS. 6A and 6B, the top surface 2120 of the active region 2100 is on a {100} crystal plane, and the side surfaces 2140 of the active region 2100 are on {100} crystal planes, by orienting the channel 2200 in a <100> channel direction, wherein current flows substantially along the <100> channel direction. In this manner, the top and side surfaces formed on a {100} crystal plane can reduce degradation of NBTI, as distinguished from side surfaces formed on {110} crystal planes, because the side channels of triple gate transistors on a {100} surface have lower surface trap density than a {110} surface.

As shown in FIGS. 6A and 6B, in this embodiment, the triple gate transistor includes the active region 2100 having a rounded corner 3160 for preventing an electric field from concentrating in the gate dielectric 2400 in a corner of the active region 2100.

Figure 7:
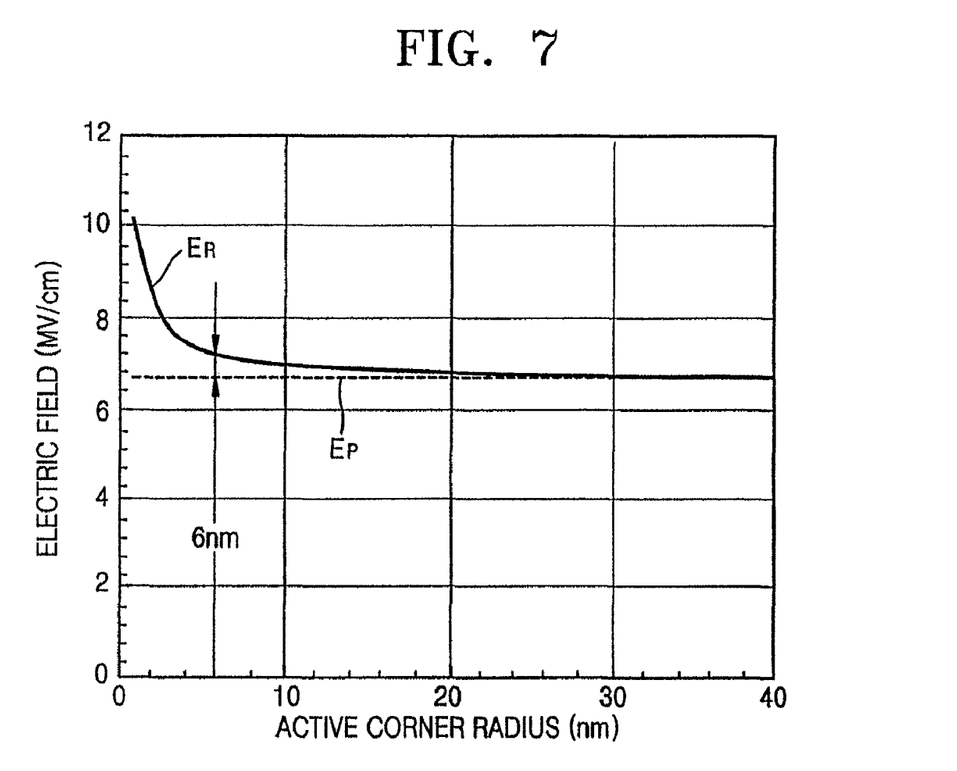
FIG. 7 contains a graph of electric field versus corner radius for the device of FIGS. 6A and 6B.

FIG. 7 contains a graph of electric field versus corner radius for the device of FIGS. 6A and 6B. With reference to the graph shown in FIG. 7, an electric field in the corner portion $E_R$ of the active region is calculated and compared to the electric field $E_P$ in the flat portion of the active region. The electric field in the flat portion is calculated, for example, under the assumption of a parallel plate metal-insulator-metal (MIM) capacitor, assuming the radius of curvature becomes larger. As the radius of curvature increases, the electric field in the corner portion $E_R$ approaches the electric field on the flat portion $E_P$. It is therefore desirable that the radius of curvature is at least 4.5 times greater than the thickness of the gate dielectric 2400. For example, when the oxide thickness of the gate dielectric 2400 is 1.3 nm, the radius of curvature of the active region must be at least 6 nm in order to reduce the electric field concentration effect. In this manner, the electric field concentrating effect on the corner is reduced by approximately 10% and an electric field of the flat portion $E_P$ is substantially achieved.

Figure 8A:
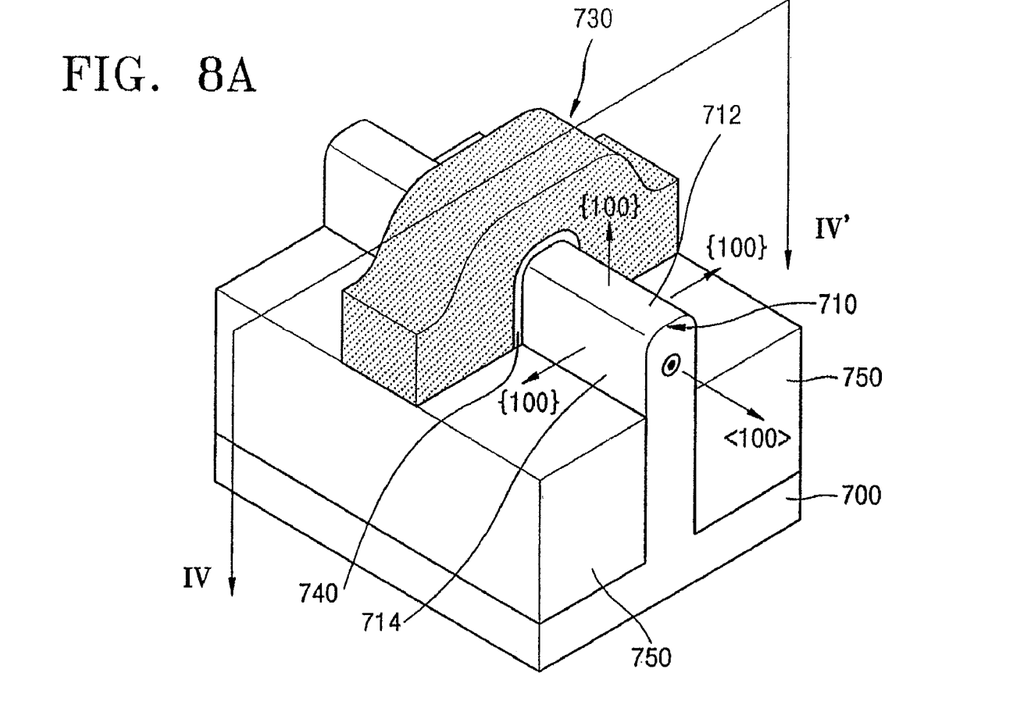
FIG. 8A contains a schematic oblique view of a triple gate transistor according to another embodiment of the present invention.
Figure 8B:
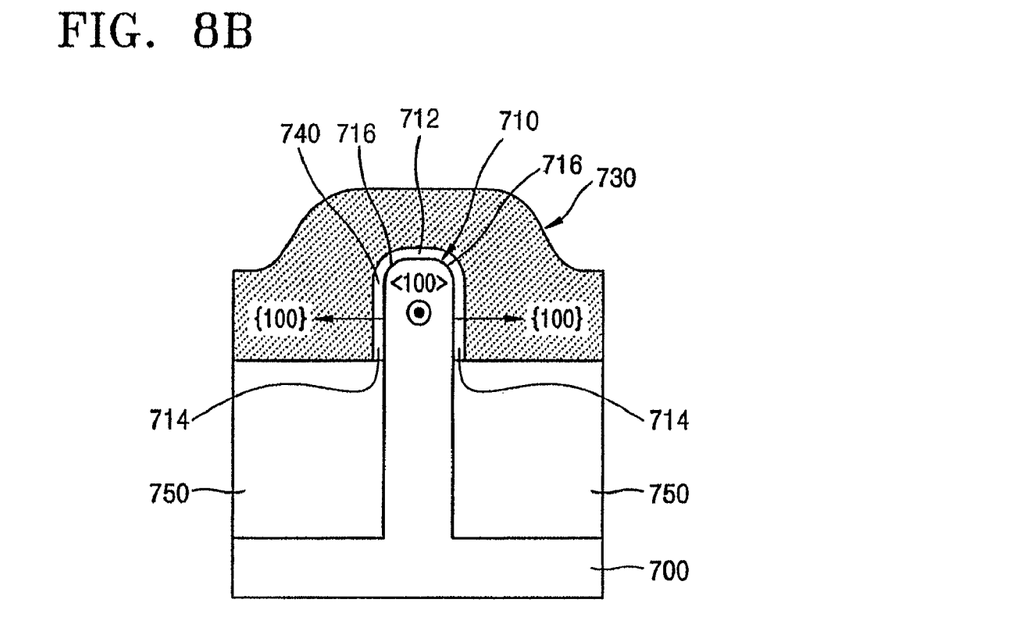
FIG. 8B contains a schematic cross-sectional view of a triple gate transistor of FIG. 8A, taken along line IV-IV' of FIG. 8A.

FIGS. 8A and 8B show a triple gate transistor formed on a bulk silicon substrate, in accordance with another embodiment of the present invention. FIG. 8A contains a schematic oblique view of the triple gate transistor according to another embodiment of the present invention, and FIG. 8B is a schematic cross-sectional view of the triple gate transistor of FIG. 8A, taken along line IV-IV' of FIG. 8A. Referring to FIGS. 8A and 8B, a Si bulk wafer 700 is formed. A shallow trench isolation (STI) region 750 is formed on the bulk wafer 700. A triple-gate transistor comprising an active region 710 and a gate electrode 730 is formed on the STI region 750. A gate dielectric layer 740 is formed on the top surface 712 and side surfaces 714 of the active region 710. The gate electrode 730 on the gate dielectric layer 740 is aligned such that the gate electrode 730 is perpendicular to the active region 710.

In this embodiment, the active region 710 and the STI region 750 are defined by etching the bulk silicon 700. The primary surface of the bulk silicon 700 has a {100} crystal plane. The active region 710 has a <100> crystal direction. Since the bulk silicon has a {100} crystal plane and the active region has a <100> crystal direction, it follows that the top surface 712 and side surfaces 714 of the active region have {100} crystal planes.

It is desirable to form a rounded corner 716 at the intersection of the top surface 712 and side surfaces 714 of the active region, thus forming a radius of curvature on the active region 710.

In one embodiment, a lower portion of the STI region is filled with dielectric materials such as silicon oxide. In one embodiment, the gate dielectric and the gate electrode are formed sequentially.

Figure 9:
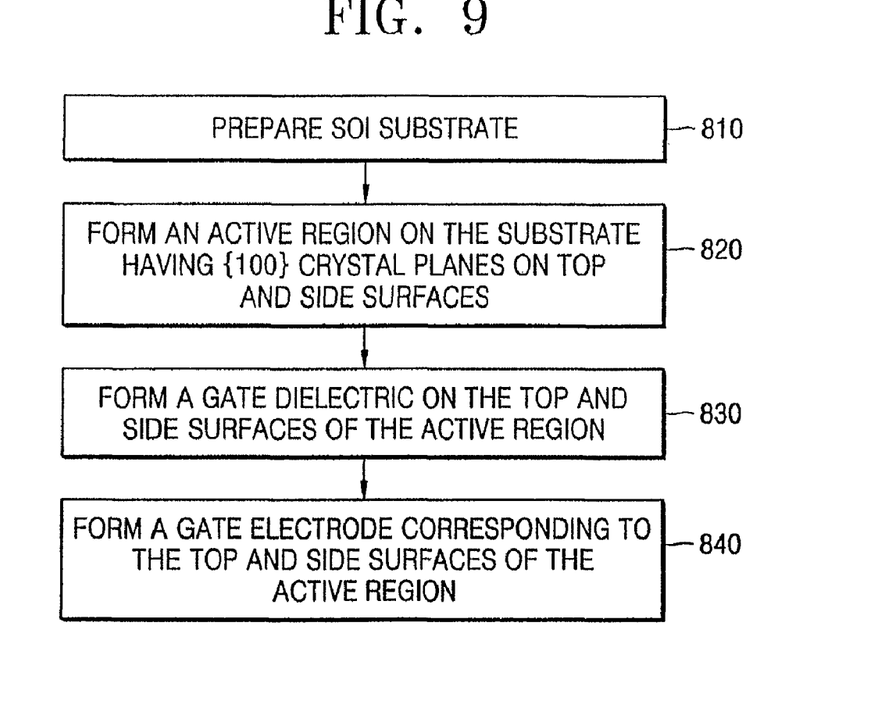
FIG. 9 contains a flowchart of the steps used to form a semiconductor device according to an embodiment of the present invention.

FIG. 9 contains a flowchart of the steps used to form a semiconductor device according to another embodiment of the present invention. First, as shown in step 810, an SOI substrate layer is prepared. Next, as shown in step 820, an active region is formed on the SOI substrate having {100} crystal planes on top and side surfaces. Next, as shown in step 830, a gate dielectric is formed on the top and side surfaces of the active region. Next, as shown in step 840, a gate electrode is formed corresponding to the top and side surfaces of the active region.

Figure 10A:
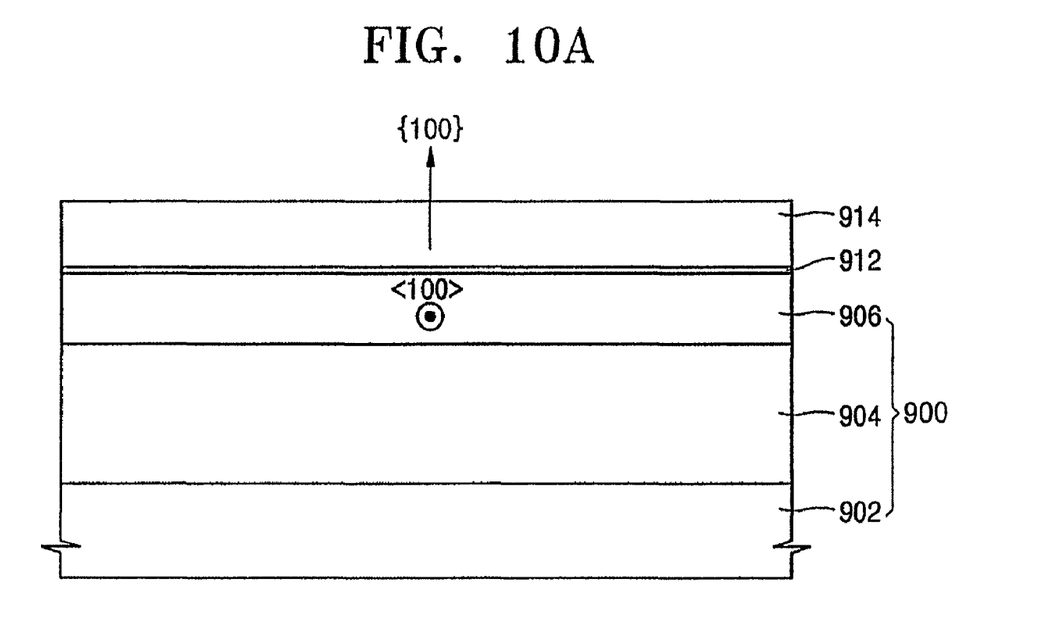
FIGS. 10A through 10G contain schematic cross-sectional views illustrating the sequential steps of forming a semiconductor device having a triple-gate transistor according to an embodiment of the present invention.

FIGS. 10A through 10G contain schematic cross-sectional views illustrating the sequential steps of forming a semiconductor device having a triple-gate transistor according to one embodiment of the present invention. As shown in FIG. 10A, a structure 900 including a SI supporting substrate 902, a buried oxide layer 904, and a silicon surface layer 906 is formed. A buffer oxide layer 912 with a thickness of approximately 5-10 nm is formed on the structure 900. A silicon nitride layer 914 with a thickness of approximately 100 nm is then formed on the buffer oxide layer 912. The primary surface of the structure 900 is a {100} crystal plane orientation. In one embodiment, the silicon surface layer 906 of the structure 900 is bonded to the Si supporting substrate 902 such that the <110> direction of silicon surface layer 906 is aligned in the same direction as that of the Si supporting substrate 902, wherein the silicon surface layer 906 and the Si supporting substrate 902 are in the <110> direction. Alternatively, the <110> direction of the silicon surface layer 906 is aligned at 45 degrees rotated from the <110> direction of the Si supporting substrate 902.

Figure 10B:
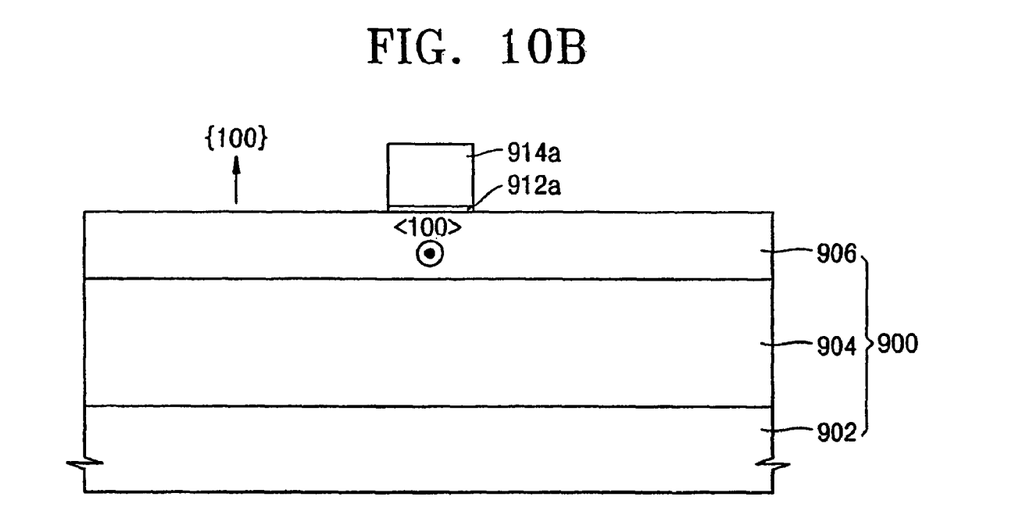

As shown in FIG. 10B, the silicon nitride (SiN) layer 914 and the buffer oxide layer 912 are etched to form a mask including a SiN pattern 914a and a buffer oxide pattern 912a defining the active region. The mask defines the active region such that the active region has a crystal direction of <100> in the silicon surface layer 906.

Figure 10C:
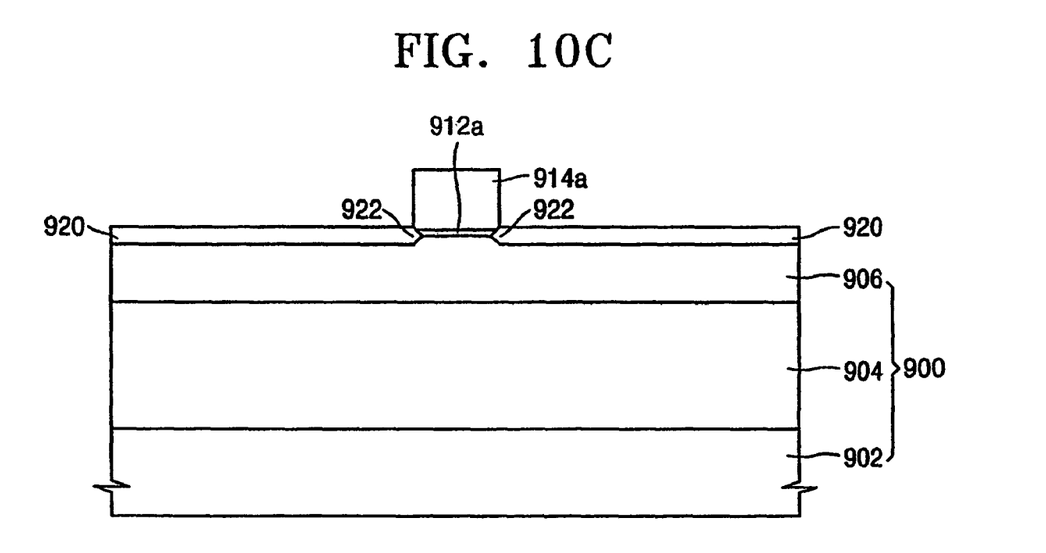

As shown in FIG. 10C, the structure 900 is oxidized, creating an oxidized layer 920 having an oxidation thickness of approximately 10 nm. During the oxidation process, oxidants slightly enter the buffer oxide layer 912a under the SiN mask 914a from the edge of the SiN pattern to form a "bird's beak" 922 shape. The "bird's beak" 922 shape determines the curved intersection of the top and side surfaces formed in subsequent steps.

Figure 10D:
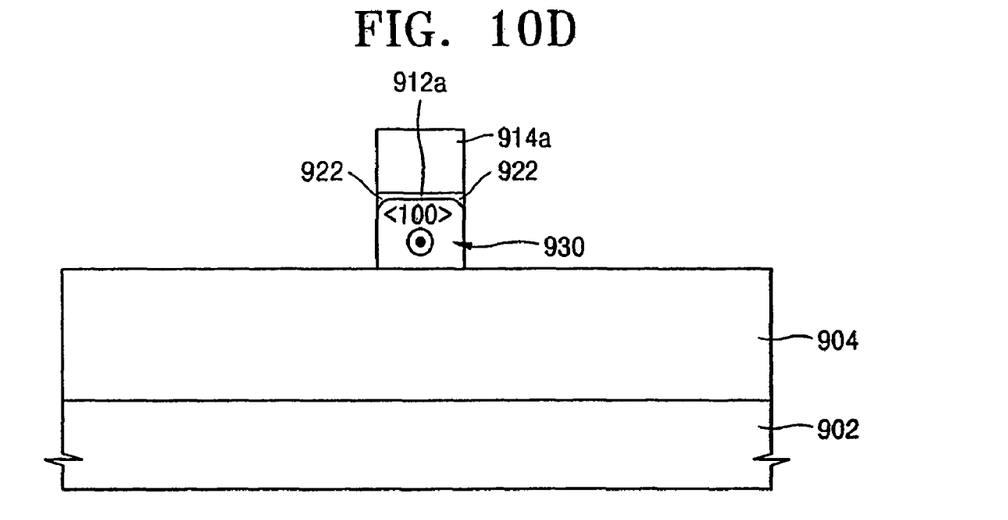

As shown in FIG. 10D, the oxidized layer 920 and the silicon surface layer 906 are etched using the SiN mask 914a to form a region of active silicon 930. When the silicon surface layer 906 is formed having a <100> direction, the active silicon region 930 is subsequently formed having a <100> direction.

Figure 10E:
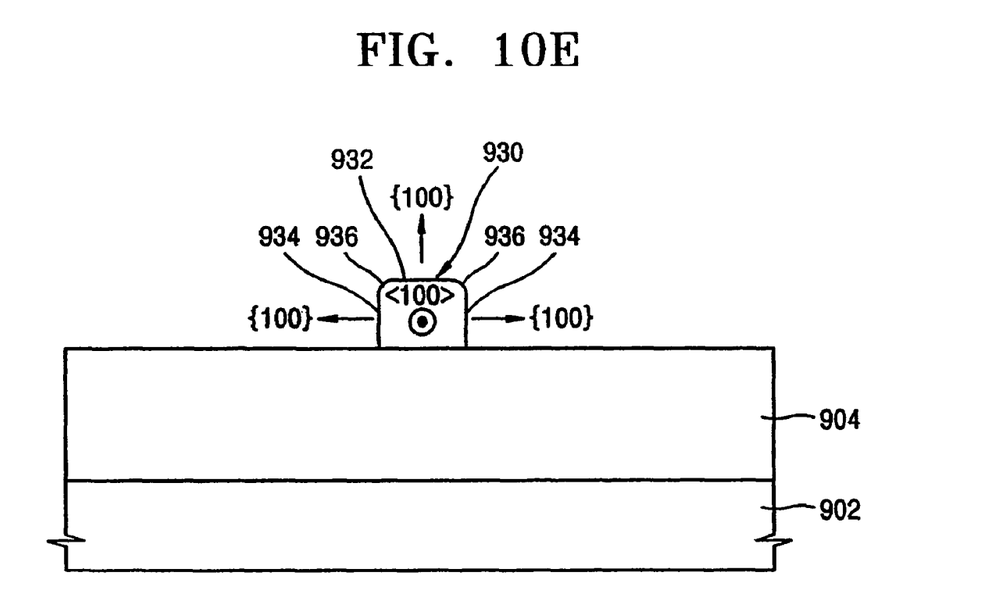

As shown in FIG. 10E, the SiN 914a and the oxide 922 are removed. The active silicon 930 has the rounded active corner 936 at the intersection of the top and side surfaces of the active silicon 930, due to the "bird's beak" formed during the oxidation step. In addition, the top and side surfaces of the active silicon 930 have a {100} orientation.

Figure 10F:
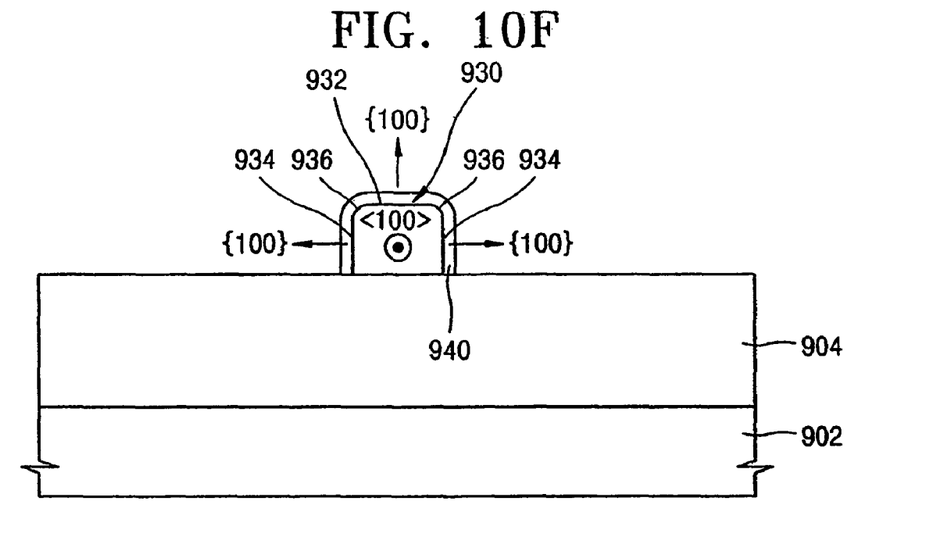

As shown in FIG. 10F, the surface of the active silicon 930 is oxidized to form a gate dielectric layer 940. The gate oxide thickness is approximately 1.3 nm. The gate dielectric layer 940 is formed by a CVD or ALD method. SiN, high-k dielectric materials, or a composite of them can be used in place of silicon oxide.

Figure 10G:
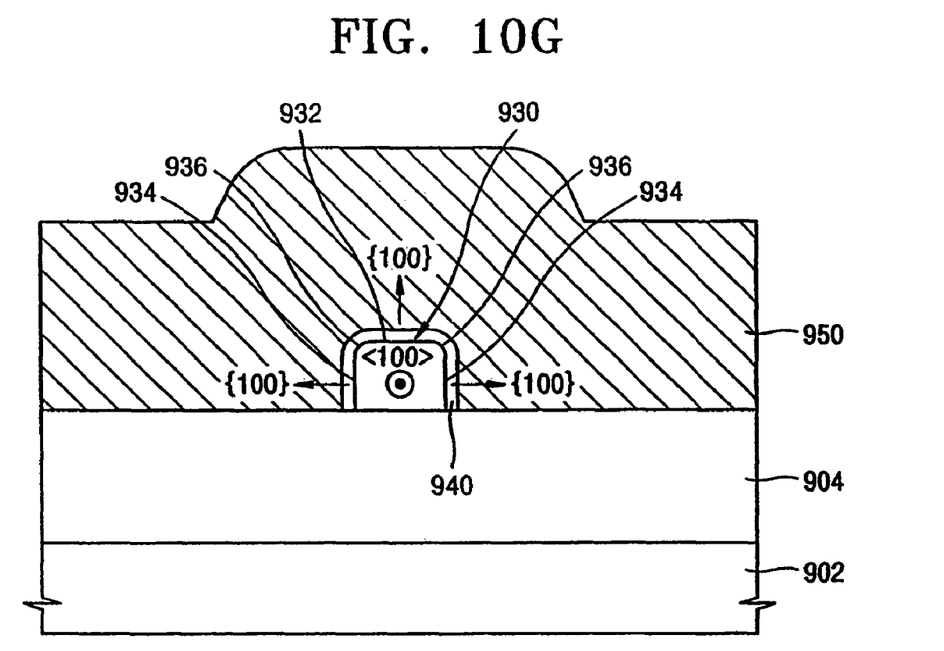

As shown in FIG. 10G, a gate electrode 950 is formed. The gate electrode 950 can have a thickness of approximately 80 nm. Source/drain implantation, silicidation, contact formation, and metal formation can be subsequently performed in conventional sequence to complete the triple gate transistor formation.

In this manner, by selecting the channel direction of the transistor as a <100> channel direction, a reduction in the degradation of NBTI in triple gate transistors is achieved.

Figure 11:
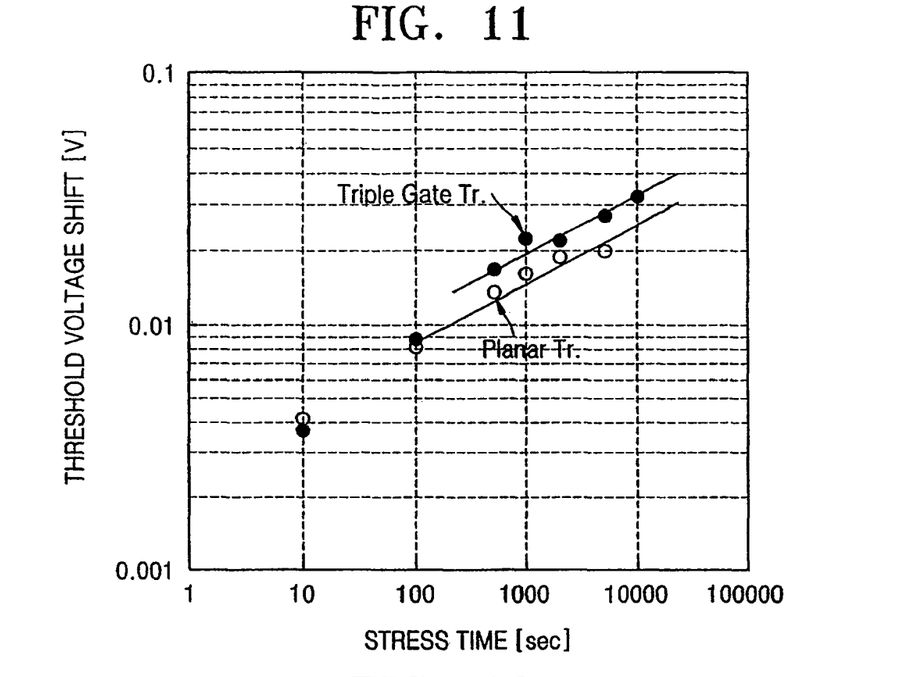
FIG. 11 contains a graph which compares the time evolution of a threshold voltage shift caused by NBTI stress between a p-channel triple gate transistor with a channel direction of <110> and planar transistors.

FIG. 11 contains a graph describing the time evolution of the threshold voltage shift caused by NBTI stress in (1) conventional p-channel triple-gate transistors having a <110> channel direction, and (2) planar transistors. It is shown that conventional triple gate transistors in a <110> channel direction have a significantly greater threshold voltage shift than planar transistors. As explained above, this higher shift is due to the {110} side surface of the triple-gate transistor. This considerable difference in threshold voltage shift can result in a significant increase over the device's lifetime.

Figure 12:
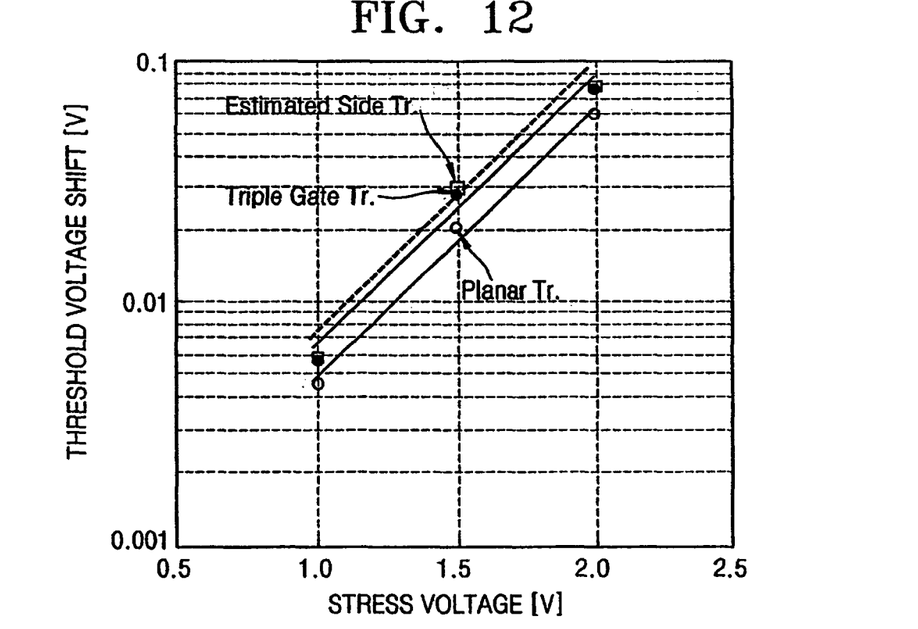
FIG. 12 contains a graph which compares the stress gate voltage dependence of the threshold voltage shift caused by NBTI stress between p-channel triple gate transistors with a channel direction of <110> and planar transistors.

FIG. 12 contains a graph showing the stress gate voltage dependence of the threshold voltage shift caused by NBTI stress for the conventional p-channel triple gate transistor with a channel direction of <110> and planar transistors.

Figure 13:
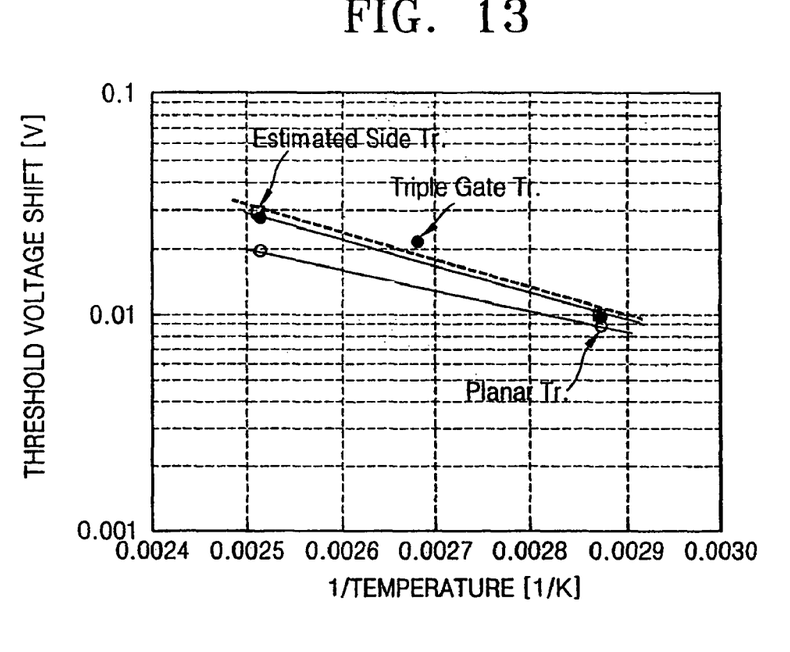
FIG. 13 contains a graph which compares the stress temperature dependence of a threshold voltage shift caused by NBTI stress between p-channel triple gate transistors with a channel direction of <110> and planar transistors.

FIG. 13 contains a graph showing the stress temperature dependence of the threshold voltage shift caused by NBTI stress for a conventional p-channel triple gate transistor having a channel direction of <110> and planar transistors.

FIGS. 12 and 13 contain graphs showing the side surface components of the threshold voltage shift caused by NBTI in conventional triple gate transistors. The conventional triple gate transistor having a <110> channel direction has a higher threshold shift than planar transistors due to the side surface of the conventional triple gate transistor having a {110} crystal orientation.

Figure 14:
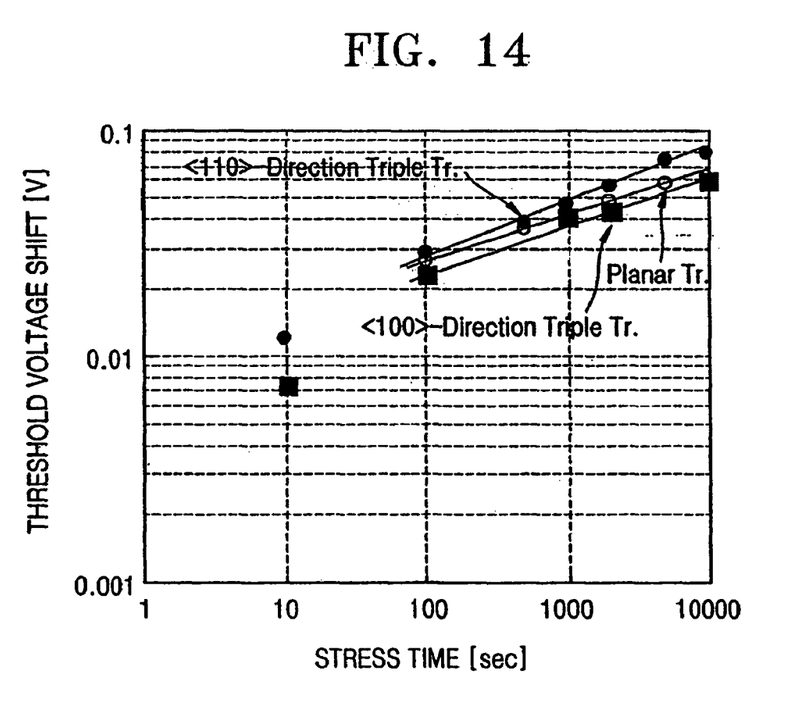
FIG. 14 contains a graph which illustrates the NBTI result of the present invention.

FIG. 14 contains a graph showing an improved NBTI result of the present invention. By changing the channel direction of the active region of the triple gate transistor from <110> to <100>, the side channel surface is changed from a {110} surface to a {100} surface, in concert with active region edge radius control, resulting in a smaller threshold voltage shift than both conventional <110> triple gate transistors and planar transistors, and improving the degradation of NBTI.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
  a semiconductor wafer;
  a shallow trench isolation region on the semiconductor wafer; and
  a triple gate transistor on the semiconductor wafer in proximity to the shallow trench isolation region, the triple gate transistor comprising:
    an active region having three current-carrying surfaces including a current-carrying top surface and two current-carrying side surfaces, wherein the three current-carrying surfaces are formed in crystal planes of a same first crystal orientation, and wherein the active region is oriented in a first direction;
    a gate dielectric formed on the current-carrying top and side surfaces of the active region; and
    gate electrodes foamed on the gate dielectric and aligned perpendicular to the active region such that current flows in the first direction.

2. The semiconductor device of claim 1, wherein the crystal planes of the first orientation are {100} crystal planes.

3. The semiconductor device of claim 1, wherein the first direction is the <100> crystal direction.

4. The semiconductor device of claim 1, wherein the semiconductor wafer comprises an orientation indicator that indicates a <110> crystal direction, and wherein the active region is aligned 45 degrees with respect to the orientation indicator.

5. The semiconductor device of claim 1, wherein an intersection of the top and side surfaces of the active region is curved.

6. The semiconductor device of claim 5, wherein a radius of curvature at the intersection of the top and side surfaces is at least 4.5 times the thickness of the gate dielectric.

7. The semiconductor device of claim 1, wherein a lower portion of the shallow trench isolation region contains a dielectric material.

* * * * *